(12) United States Patent
Shimanovich et al.

(10) Patent No.: US 12,731,635 B2
(45) Date of Patent: Sep. 8, 2026

(54) DELAY CIRCUITRY BASED ON PSEUDO-SRAM CELLS FOR CONTROLLING THE SRAM SENSE AMPLIFIER TIMING

(71) Applicant: International Business Machines Corporation, Armonk, NY (US)

(72) Inventors: Klimentiy Shimanovich, Ramat Gan (IL); Elazar Kachir, Haifa (IL); Tomer Abraham Cohen, Binyamina (IL); Noam Jungmann, Holon (IL); Muhammad Suleiman, Nazareth (IL); Hezi Shalom, Tel Aviv (IL); Avital Rafaevich, Kiryat Ekron (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 228 days.

(21) Appl. No.: 18/617,168

(22) Filed: Mar. 26, 2024

(65) Prior Publication Data

US 2025/0308583 A1 Oct. 2, 2025

(51) Int. Cl.
*G11C 11/419* (2006.01)
*G11C 5/14* (2006.01)

(52) U.S. Cl.
CPC ............ *G11C 11/419* (2013.01); *G11C 5/147* (2013.01)

(58) Field of Classification Search
CPC ...... G11C 11/418; G11C 11/419; G11C 5/147
USPC .................................................. 365/189.011
See application file for complete search history.

(56) References Cited

U.S. PATENT DOCUMENTS 5,936,905 A 8/1999 Proebsting
6,958,943 B1 * 10/2005 Chan ........................ G11C 7/08 365/194
8,279,659 B2 * 10/2012 Cho ....................... G11C 7/227 365/194
9,576,621 B2 2/2017 Seshadri et al.
9,886,206 B1 2/2018 Wang et al.
2005/0068843 A1 3/2005 Takeuchi
2005/0254317 A1 11/2005 Chan et al.
2011/0110174 A1 * 5/2011 Cho ......................... G11C 7/22 365/207
2011/0255359 A1 10/2011 Sachdev et al.
(Continued)

OTHER PUBLICATIONS

Ataei et al., Multi Replica Bitline Delay Technique for Variation Tolerant Timing of SRAM Sense Amplifiers, Conference Paper, May 2015.

(Continued)

*Primary Examiner* — Sung Il Cho
(74) *Attorney, Agent, or Firm* — Yuanmin Cai, Esq.; Kevin P. Radigan, Esq.; Heslin Rothenberg Farley & Mesiti P.C.

(57) ABSTRACT

Embodiments herein describe circuitry for mimicking SRAM cells. Instead of mimicking (or modeling) the entire SRAM cell, the mimic SRAM cells can mimic only the read path, which may include a pFET and two nFETs. In one embodiment, the mimic SRAM circuitry includes multiple selectable banks of mimic cells. During testing, the number of banks can be selected that best represent the worst case scenario—e.g., the PVT corner with the worst process variation. In addition to selecting the number of banks of mimic cells, the gate voltage of the transistors in the mimic cells can be adjusted.

20 Claims, 6 Drawing Sheets

(56) References Cited

U.S. PATENT DOCUMENTS

| | | | | |
|---|---|---|---|---|
| 2014/0204660 | A1* | 7/2014 | Chandwani | G11C 11/419 365/156 |
| 2015/0248923 | A1* | 9/2015 | Lin | G11C 7/08 365/191 |
| 2022/0406343 | A1 | 12/2022 | Chiu et al. | |

OTHER PUBLICATIONS

Pullareddy et al., Design and Implementation of High Speed Sense Amplifier for SRAM, WSEAS Transactions on Electronics, vol. 9, 2018.

Arslan et al., Variation-Tolerant SRAM Sense-Amplifier Timing Using Configurable Replica Bitlines, IEEE 2008 Custom Intergrated Circuits Conference (CICC), pp. 414-418.

Attarzadeh, et al., "An Auto-Calibrated, Dual-Mode SRAM Macro Using a Hybrid Offset-Cancelled Sense Amplifier", Microelectronics Journal, Feb. 18, 2014.

* cited by examiner

DELAY CIRCUITRY BASED ON PSEUDO-SRAM CELLS FOR CONTROLLING THE SRAM SENSE AMPLIFIER TIMING

BACKGROUND

A sense amplifier is used to ensure successful read operations of static random-access memory (SRAM) cells and speed up read operation of SRAM memories. Sense amplifiers are more commonly used in high density memories with large number of cell-per-bit-line (CBL). Sense amplifiers sense a small differential signal between a Bit-Line-True (BLT) to Bit-Line-Comp (BLC) (or Bit-Line Bar) which sample the data in the SRAM memory cell and create a full-rail differential with a fast slew-rate. This is achieved by controlling the timing of sense amplifier enable (SAE) signal.

The sense amp margin target—i.e., the voltage difference between BLT and BLC—should remain as constant as possible across process, voltage, temperature (PVT) corners to guarantee correct functional operation, and to satisfy best performance. However, the threshold voltage variation of transistors used in SRAM cells is larger than in transistors used in typical logic devices (e.g., transistors used for circuitry external to the SRAM cell) because of the large SRAM cell count used in array and dependency on the process. The timing of the SAE signal varies across PVT. Therefore, the sense amp margin varies significantly due to the difference between the threshold voltage of SRAM transistors and threshold voltage of non-SRAM transistors.

SUMMARY

According to one embodiment of the present invention, a circuit includes static random-access memory (SRAM) cells, a sense amplifier coupled to the SRAM cells, and SRAM mimic circuitry including a plurality of selectable banks of SRAM mimic cells, where the SRAM mimic circuitry is configured to select a subset of the selectable banks to drive a sense amplifier enable (SAE) signal for enabling the sense amplifier during a read operation of the SRAM cells.

According to one embodiment of the present invention, an integrated circuit that includes SRAM cells, a sense amplifier coupled to the SRAM cells, and SRAM mimic circuitry including a plurality of selectable banks of SRAM mimic cells, where the SRAM mimic circuitry is configured to select a subset of the selectable banks to drive a sense amplifier enable (SAE) signal for enabling the sense amplifier during a read operation of the SRAM cells.

According to one embodiment of the present invention, a method includes testing operation of SRAM cells coupled to a sense amplifier during a read operation, changing a number of banks of mimic SRAM cells that are selected and a gate voltage of transistors in the mimic SRAM cell in order to adjust a sense amplifier enable signal that enables the sense amplifier, identify parameters resulting in satisfactory performance of the read operation, and setting, based on the parameters, SRAM circuitry containing the banks of mimic SRAM cells and an adjustable voltage supply that controls the gate voltage.

DETAILED DESCRIPTION

Embodiments herein describe circuitry for mimicking SRAM cells using non-SRAM transistors, thereby saving space. Further, instead of mimicking (or modeling) the entire SRAM cell, the mimic SRAM cells can mimic only the read path, which may include a pFET and two nFETs. In one embodiment, the mimic SRAM circuitry includes multiple selectable banks of mimic cells. The banks can have multiple mimic SRAM cells in parallel (e.g., one bank can have only one mimic cell, another bank can have two mimic cells connected in parallel, and another bank can have four mimic cells connected in parallel, and so forth). During testing, the number of banks can be selected that best represent the worst case scenario—e.g., the PVT corner with the worst process variation.

In addition to selecting a number of banks, the circuitry can also include an adjustable voltage supply which controls the gate voltages of the nFETs in the mimic cells. The adjustable voltage can reduce the gate voltage in increments—e.g., 20% reduction of the full supply, 40% reduction of the full supply, etc. When testing, both the adjustable voltage supply and the number of selected banks of the mimic cells can be changed to identify parameters that are satisfactory for the worst case scenario and result in a correct read operation. These parameters can then be used during normal operation to drive the SAE signal and the sense amplifiers, thereby ensure proper functionality of the read operation across process corners as well as improve performance.

Figure 1:
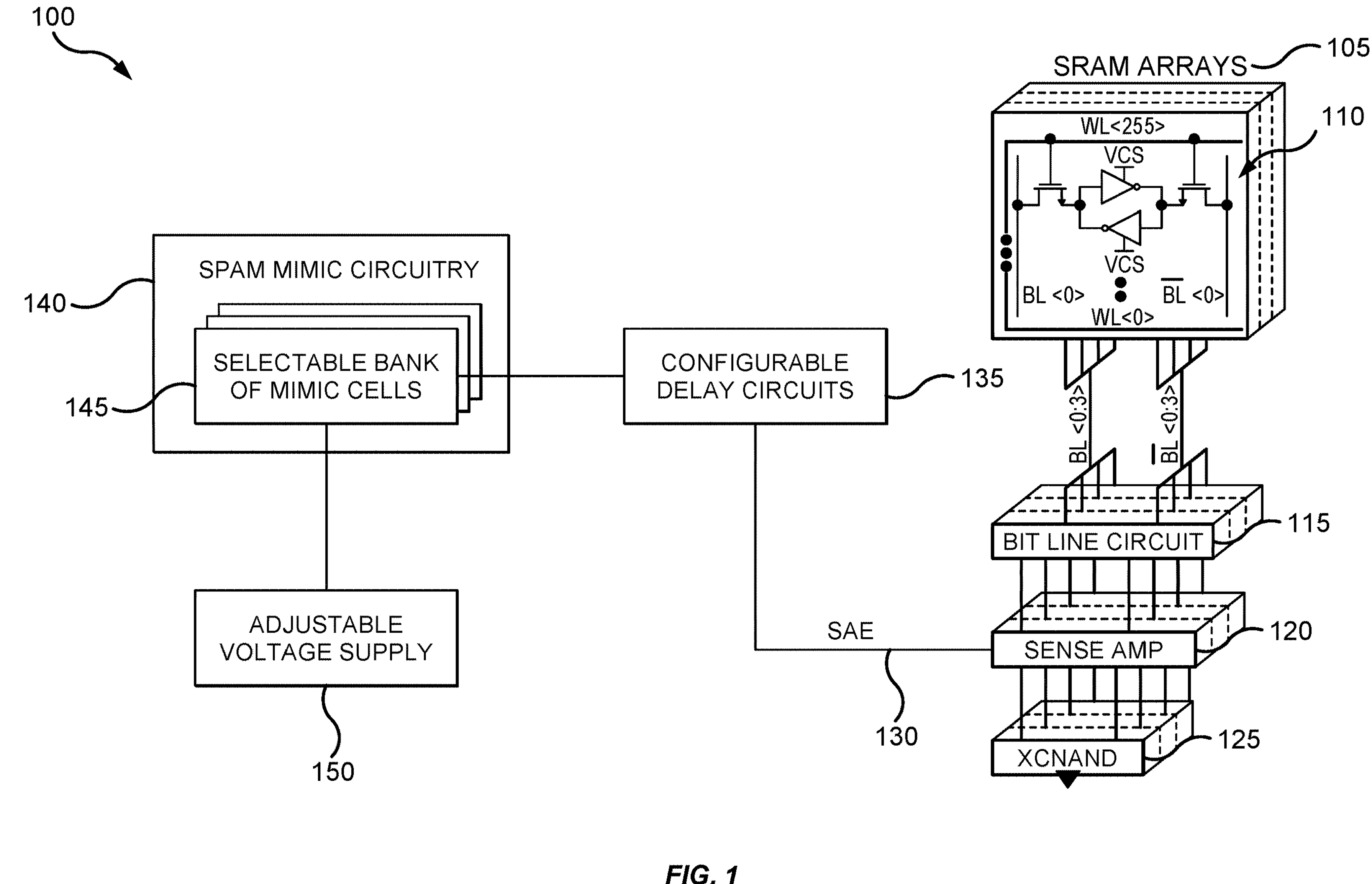
FIG. 1 illustrates SRAM mimic circuitry for driving the SAE signal for sense amplifiers, according to one embodiment.

FIG. 1 illustrates SRAM mimic circuitry 140 for driving the SAE signal 130 for sense amplifiers 120, according to one embodiment. Generally, FIG. 1 illustrates a system 100 that includes SRAM arrays 105, bit line circuits 115, the sense amplifiers 120, cross coupled NANDs (XCNAND) 125, configurable delay circuit 135, SRAM mimic circuitry 140, and an adjustable supply voltage 150. In one embodiment, the system 100 may be implemented on an integrated circuit (e.g., an application specific integrated circuit (ASIC), processor, field programmable gate array (FPGA), system on a chip (SoC), and the like.

The SRAM arrays 105 can include any number of columns and rows. The word lines (WL) can extend horizontally between the columns (0:255 in this example) while each column includes a bit line and a bit line bar which extend vertically. The bit lines are received by the bit line circuit 115 and then at the sense amplifiers (amps) 120. The output of the sense amps 120 are received at the XCNAND 125 during a read operation.

FIG. 1 also illustrates the SAE signal 130 which enable the outputs of sense amps 120 during a read operation. For example, the SAE signal 130 may be used as a gate signal for transistors in the sense amps 120 that control the output of the sense amps 120.

Figure 2:
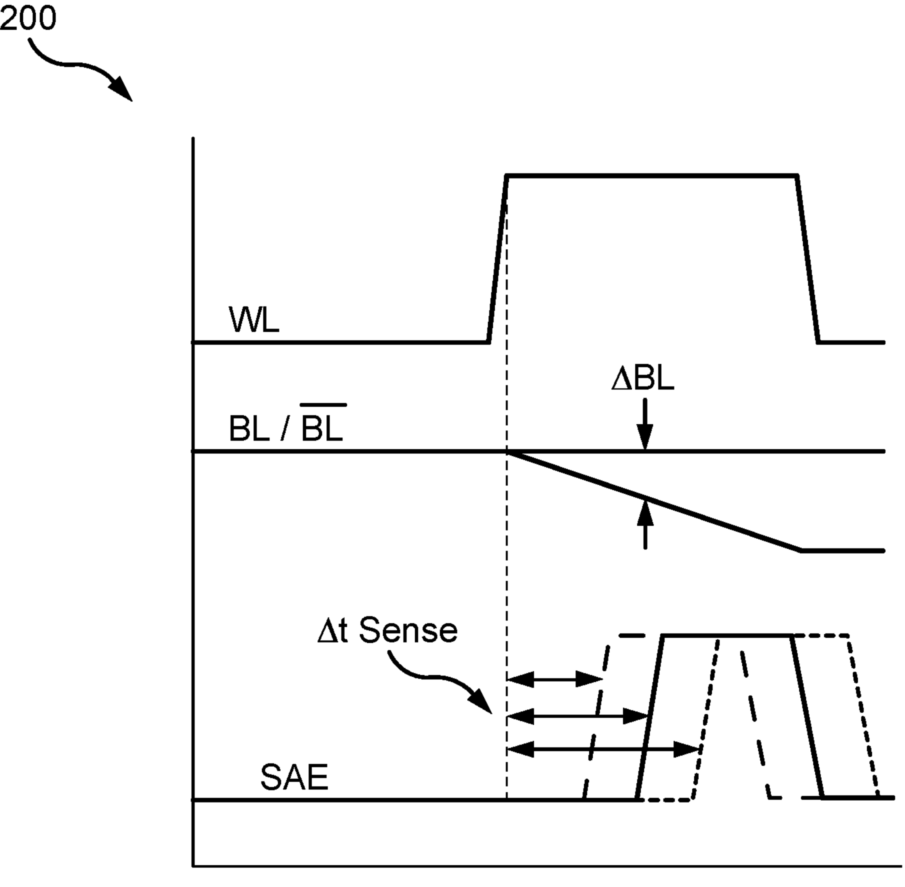
FIG. 2 is a chart illustrate timing variation in the SAE signal, according to one embodiment.

As mentioned above, variations between SRAM and non-SRAM transistors in the PVT corners can cause variations in the SAE signal 130 for a set sense margin value. FIG. 2 is a chart 200 that illustrates timing variation in the SAE signal, according to one embodiment. The chart 200 illustrates three signals: the WL, the bit lines, and the SAE signal. The chart 200 illustrates that the start time of the SAE signal can vary from being too early or being too late. The target (or optimal) sense margin of the sense amp (e.g., 100 mv) is shown as delta BL (ΔBL). If the sense amplifier turns on too early, the sense margin is too small (e.g., 80 mV) which can make the read operation non-functional, but too late and the sensor margin is too large (e.g., 120 mV) which means the read operation takes longer (slower performance). Because the timing of the SAE signal varies across PVT corners, FIG. 2 illustrates this variation which can have a negative impact since the SAE signal determines the sense margin.

Figure 3:
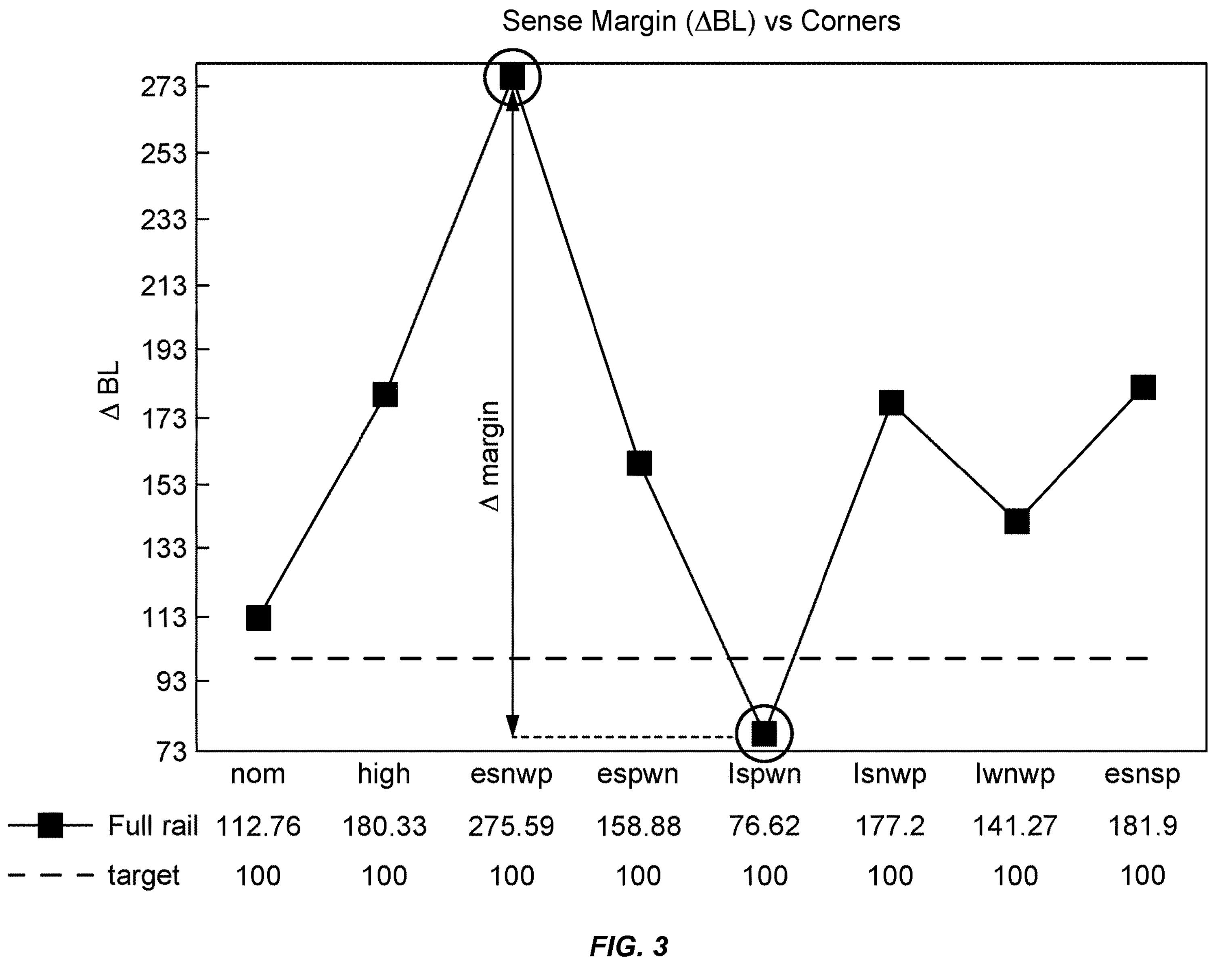
FIG. 3 is a chart illustrating sense margin variations in PVT corners, according to one embodiment.

FIG. 3 is a chart 300 that illustrates sense margin variations in PVT corners, according to one embodiment. The x-axis of the chart 300 illustrates different process corners while the y-axis illustrates the sense margin ΔBL. The delta margin (Δmargin) illustrates the greatest variation between two sensed margins. At the process corner esnwp the sense margin is 275.59 mV but at the process corner lspwn the sensor margin is only 76.62 mV. Thus, at the process corner esnwp it requires a much longer time to perform the read operation (since the signals have to be discharged) but at the process corner lspwn the read operation may fail because of the small ΔBL. It is desired to reduce the Δmargin between the process corners, which can be achieved using the circuitry in FIG. 1 (and other embodiments discussed below).

Returning to FIG. 1, the system 100 calibrates the SAE signal 130 to have matching reaction to the SRAM cells 110 across PVT corners, which reduces the ΔBL variation across corners by introducing new circuitry which mimics the changes in SRAM cell current. This is achieved by using the SRAM mimic circuitry 140, the configurable delay circuit 135, and the adjustable voltage supply 150. There can also be a feedback loop which is described in more detail in FIG. 4. Also, while these three components are shown in FIG. 1, some may be optional. For example, the ΔBL variation across corners can be reduced by using the SRAM mimic circuitry 140 in conjunction with adjustable voltage supply 150 even if the configurable delay circuit 135 is omitted from the system 100. However, adding the configurable delay circuit 135 allows accurately (with step of ~3-7 mV) shifting the reduced ΔBL variation across corners around a desired Sense Margin value and further improve the cache performance.

In one embodiment, the configurable delay circuit 135 contains CMOS based delay circuitry with several timing steps. The configurable delay circuit 135 is an additional degree of freedom in controlling of SAE timing. In one embodiment, the configurable delay circuit 135 is also used for post silicon hardware testing.

The SRAM MIMIC circuitry 140 includes selectable banks 145 of SRAM mimic cells. Each bank 145 can have a different number of SRAM mimic cells—e.g., one bank can have one SRAM mimic cell, another bank can have two SRAM mimic cells, another bank can have four SRAM mimic cells, and so forth. The number of banks 145 that are selected can be based on reaching matching voltage overdrives between the SRAM mimic cells and the SRAM cells 110 and matching the voltage overdrive variation across PVT corners.

In one embodiment, the transistors in the SRAM mimic cells are different from the transistors in the SRAM cells 110. For example, the transistors in the SRAM mimic cells can have different voltage thresholds than the transistors in the SRAM cells 110. However, this can be adjusted by using the adjustable voltage supply 150 to change the gate voltage being supplied to the transistors in the SRAM mimic cells. Advantageously, using different transistors in the SRAM mimic cell can save space since more compact transistors can be used rather than the special transistors typically used in the SRAM cells 110. In any case, the SRAM mimic circuitry can be configured to mimic the changes in the current in the SRAM cells 110 in their read paths.

The adjustable voltage supply 150 provides a rail voltage that ultimately affects (or sets) the gate voltage (VG) of the transistors in the selectable banks 145 of SRAM mimic cells. As discussed in more detail in FIG. 6, during a testing or simulation phase, the voltage provided by the adjustable voltage supply 150 (as well as the number of banks 145 that are selected) can be altered until the current output by the SRAM mimic circuitry 140 to the configurable delay circuit 135 matches the current in the SRAM cells 110. For example, the adjustable voltage supply 150 can reduce the gate voltage VG delivered to the SRAM mimic transistors so a current matches the current of the of the SRAM cell transistors across PVT corners, despite using different types of transistors.

Figure 4:
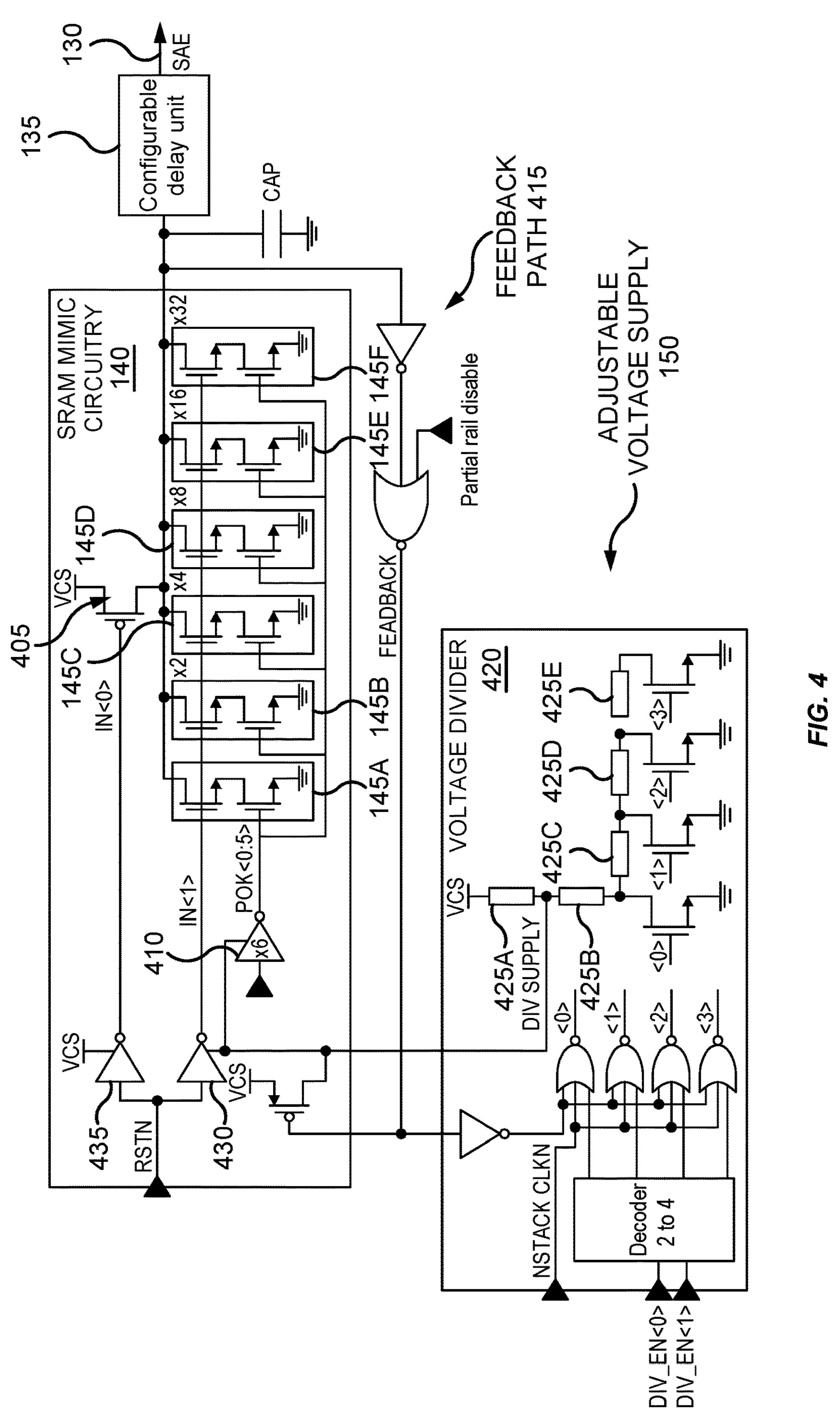
FIG. 4 illustrates one implementation of the circuitry illustrated in FIG. 1, according to one embodiment.

FIG. 4 illustrates one implementation of the circuitry illustrated in FIG. 1, according to one embodiment. FIG. 4 illustrates exemplary circuit implementations for the SRAM mimic circuitry 140 and the adjustable voltage supply 150. FIG. 4 also illustrates a feedback path 415 from the output of the SRAM mimic circuitry 140 to one of its inputs. FIG. 4 also illustrates the configurable delay unit 135 which outputs the SAE signal 130 to the sense amps 120 in FIG. 1 (which are not shown in FIG. 4).

The SRAM mimic circuitry 140 in FIG. 4 includes a single pFET 405 in a pull-up network and a series of stacked nFETS which are connected in parallel in pull down networks (x1, x2, x4, x8, x16, and x32) to form the banks 145A-F of SRAM mimic cells. Specifically, the two nFETs in series (or in a stack) mimic the two nFETS in the SRAM cell (e.g., the SRAM cell 110 in FIG. 1) pull-down (passgate and pull-down). This is achieved by lowering the gate voltages of the stacked nFETs in the banks 145 which allows the matching of Voltage overdrives ($V_{OV}$'s) between the selected SRAM cell and the stacked nFETs in the bank 145 (or banks 145) to match $V_{OV}$'s variation across corners.

In this example, each bank 145 has a different number of stacked nFETs. That is, bank 145A includes only one stack of nFETs connected between the pFET 405 and the common voltage (ground). However, bank 145B includes two stacks of nFETs which are connected in parallel between the pFET 405 and the common voltage (ground). Bank 145C includes four stacks of nFETs which are connected in parallel between the pFET 405 and the common voltage (ground), and so forth. While FIG. 4 illustrates each bank 145 having a different number of stacks, in other implementations some banks may have the same number of stacks of transistors. Further, while six banks 145 are shown, the SRAM mimic circuitry 140 may have more, or fewer than this number.

The SRAM mimic circuitry 140 also includes six inverters 410 which each are respectively coupled to one of the banks 145. The six inverters 410 can be controlled to selectively activate (or drive) one or more of the banks 145 using the POK<0:5> signal. For example, bank 145A and 145C may be activated while banks 145B, D, E, and F are not (e.g., their respective inverters 410 output a gate voltage that opens these nFETs). Thus, by controlling the input of the inverters 410, the system can control which banks 145 are active (e.g., have gates that are closed so that current flows through the stack(s) of nFETs).

The SRAM mimic circuitry 140 also includes an inverter 430 for driving a gate voltage (IN<1>) on the top nFETs in each stack in the banks 145. That is, while the inverters 410 drive the bottom nFETs in the stack, the inverter 430 drives the top nFET in each stack.

Notably, the supply voltage of the inverters 410 and the inverter 430 is set by the adjustable voltage supply 150. Because the supply voltage of the inverters 410 and 430 sets their output, the supply voltage sets the gate voltage of the nFETs in the banks 145. However, the SRAM mimic circuitry 140 also includes an inverter 435 for driving the gate voltage of the pFET 405. The supply voltage for this inverter 435 is not set by the adjustable voltage supply 150, but rather by the voltage rail VCS. Thus, in this embodiment, the gate voltage for the pFET 405 is not adjustable, unlike the gate voltages of the nFETs in the banks 145.

In FIG. 4, the adjustable voltage supply 150 is implemented using a voltage divider 420. To set the DIV_SUPPLY, which is the voltage supply for the inverters 410 and 430 in the SRAM mimic circuitry 140, the voltage divider 420 includes multiple resistors 425A-E along with transistors that can be selectively activated using an output of a decoder to connect a particular resistor 425 to ground. For example, assuming the resistors 425 have the same resistance if the signal <0> is set, then the DIV_SUPPLY is half the voltage of the rail voltage VCS. However, if the signal <3> is set by the decoder, the DIV_SUPPLY is a 20% decrease from VCS. If the signal <2> is set by the decoder, the DIV_SUPPLY is a 25% decrease from VCS. If the signal <1> is set by the decoder, the DIV_SUPPLY is a 33% decrease from VCS. Of course, these are just examples and can change depending on the value of the resistors 425 (which do not have to be the same).

In one embodiment, the resistors 425 are implemented by metal wire segments. Advantageously, using metal resistors 425 results in linear behavior across PVT corners and offers better stability to process variation when compared to using transistors to implement the resistors 425. An additional advantage of using metal resistors compared to using silicon-based resistors is area. Metal resistors do not consume area in the silicon but rather can be implemented on upper metal layers.

The voltage divider 420 serves as a virtual supply for the inverters 410 and 430. As discussed above, voltage supply changes in the inverters' 410, 430 varies the gate voltage of the stacked nFETs.

The feedback path 415 ensures that the virtual supply generated by the voltage divider 420 is only provided during the read operation of the SRAM cells to avoid DC power dissipation. In the beginning of read operation the voltage divider 420 is activated in order to slowly discharge the SRAM mimic pull down network. When the SRAM mimic output voltage is low enough, it flips the inverter on the feedback loop 415 and consequently disconnects the voltage divider 420 and biases the DIV_Supply to VCS using the FEEDBACK signal.

Figure 5:
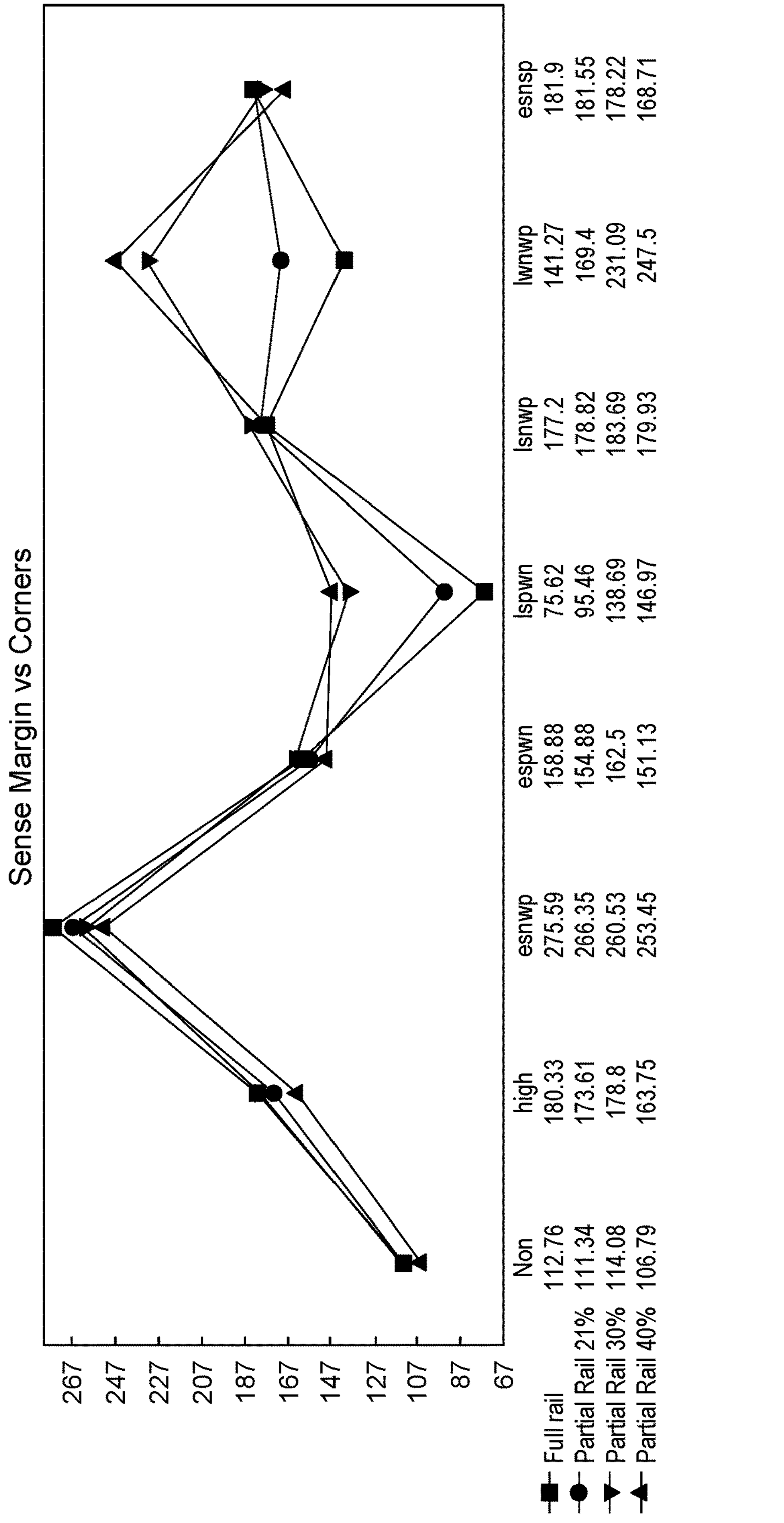
FIG. 5 is a chart illustrating sense margin variations in PVT corners when using the circuitry in FIG. 4, according to one embodiment.

FIG. 5 is a chart 500 illustrating sense margin variations in PVT corners when using the circuitry in FIG. 4, according to one embodiment. The different plots in chart 500 correspond to different virtual supplies generated by the voltage divider 420 in FIG. 4, as well as when the voltage divider 420 is bypassed using the feedback path 415 where the rail voltage (VCS) (i.e., full rail) is provided to the gates of the nFETS in the banks 145.

The y-axis of the chart 500 illustrates the voltage (in mV) of the sense margins while the x-axis illustrates different process corners. Chart 500 further illustrates that reducing the voltage rail (e.g., using the voltage divider to provide a reduced, virtual supply) can reduce the variations between the highest and the lowest sense margin (i.e., the ΔBL).

Figure 6:
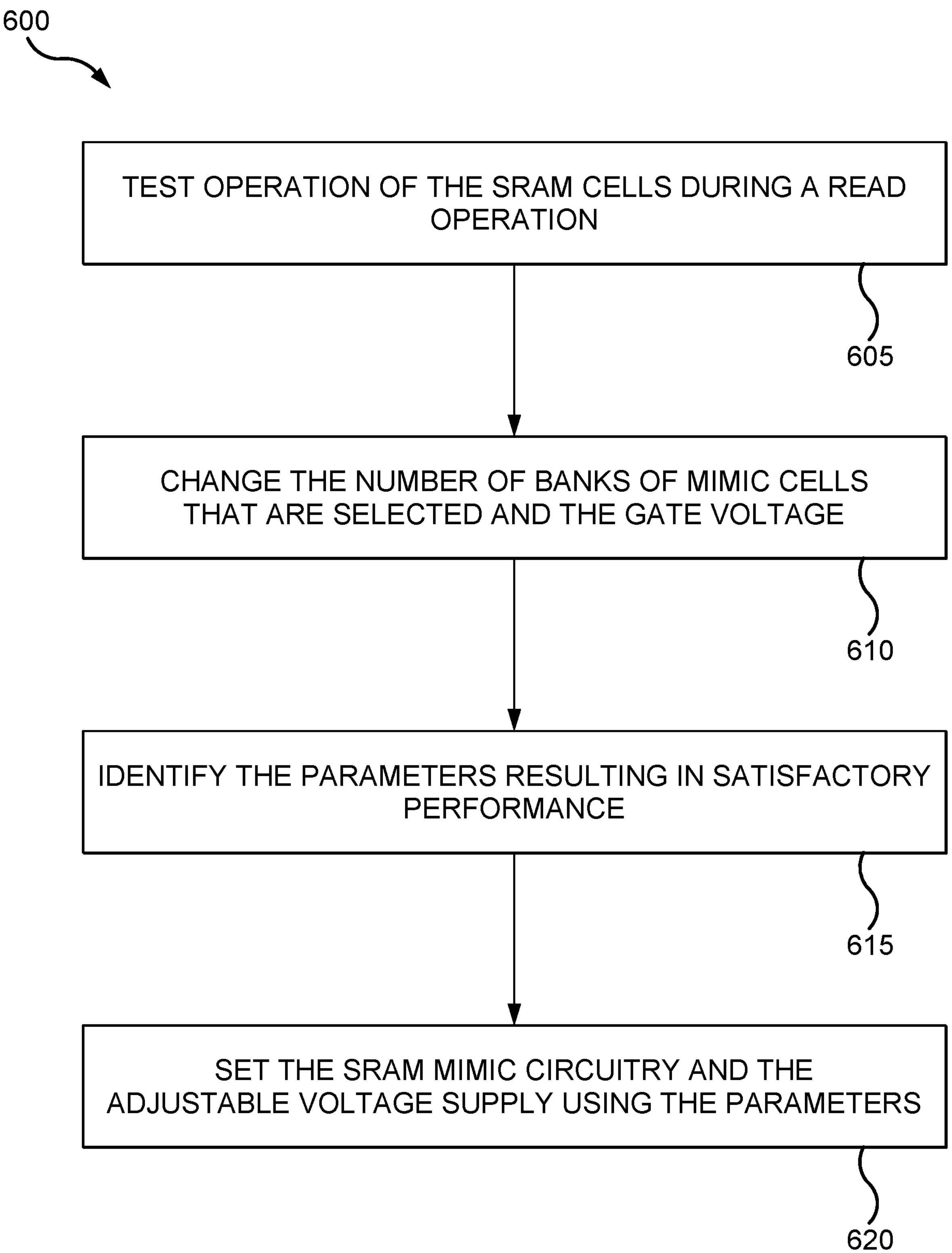
FIG. 6 is a flowchart for setting the circuitry illustrated in FIG. 1, according to one embodiment.

FIG. 6 is a flowchart of a method 600 for setting the circuitry illustrated in FIG. 1, according to one embodiment. At block 605, the system tests operation of the SRAM cells during a read operation. For example, the method 600 may execute before the system containing the SRAM cells (e.g., an IC) is put into normal operation.

At block 610, the system changes the number of banks of SRAM mimic cells that are selected and the gate voltage. Referring to FIG. 4, the system can alter the number of the banks 145 that are activate by selecting one or more of the six inverters 410. Further, the system can use the decoder in the voltage divider 420 to selectively connect the resistors 425 to change the DIV_SUPPLY provided to the six inverters, which in turn sets the gate voltage of the transistors in the selected banks.

At block 615, the system identifies the parameters resulting in satisfactory performance. For example, the system may identify the number of banks that should be selected, and their gate voltage, that results in the smallest delta in the sense margin across the process corners.

At block 620, the system sets the SRAM mimic circuitry and the adjustable voltage supply using the parameters identified at block 615. The system can then begin normal operation—e.g., cease the testing phase—where the SRAM cells can perform normal read operations and the SAE signal is driven using the configured SRAM mimic circuitry and adjustable voltage supply.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

While the foregoing is directed to embodiments of the present invention, other and further embodiments of the invention may be devised without departing from the basic scope thereof, and the scope thereof is determined by the claims that follow.

What is claimed is:

1. A circuit comprising:

static random-access memory (SRAM) cells;

a sense amplifier coupled to the SRAM cells; and

SRAM mimic circuitry comprising a plurality of selectable banks of a plurality of parallel-connected SRAM mimic cells, wherein the SRAM mimic circuitry is configured to select a subset of the selectable banks to drive a sense amplifier enable (SAE) signal for enabling the sense amplifier during a read operation of the SRAM cells, each of the plurality parallel-connected SRAM mimic cells comprises a different number of pairs of series-connected pull-down transistors, wherein a pull-up transistor connected in series with each of the pairs of series-connected pull-down transistors and a rail voltage providing a gate voltage of the pull-up transistor and wherein a gate voltage of the pairs of series-connected pull-down transistors of the subset of the selectable banks is adjusted to drive the SAE signal to mimic changes in SRAM cell current for read operations of the SRAM cells.

2. The circuit of claim 1, further comprising:

an adjustable voltage supply configured to adjust the gate voltage of the pairs of series-connected pull-down transistors in the subset of the selectable banks.

3. The circuit of claim 2, wherein the adjustable voltage supply comprises a voltage divider that is activated for the read operation of the SRAM cells.

4. The circuit of claim 3, wherein voltage divider comprises a plurality of wire resistors that have linear behavior across process, voltage, temperature (PVT) corners, wherein each of the plurality of wire resistors is selectively connected to ground by activating a respective control transistor connected to a respective wire resistor of the plurality of wire resistors.

5. The circuit of claim 2, further comprising a feedback loop coupled to an output and an input of the SRAM mimic circuitry, wherein the feedback loop is configured to selectively bypass the adjustable voltage supply so that the rail voltage is used as the gate voltage of the pairs of series-connected pull-down transistors in the subset of selectable banks.

6. The circuit of claim 2, wherein the SRAM mimic circuitry comprises:

a plurality of inverters, wherein each output of the plurality of inverters is coupled to gates of the pairs of series-connected pull-down transistors in a respective one of the plurality of selectable banks, wherein power supplies of the plurality of inverters is coupled to the adjustable voltage supply in order to adjust the gate voltage of the pairs of series-connected pull-down transistors in the subset of selectable banks.

7. The circuit of claim 1, further comprising:

a configurable delay circuit configured to receive the SAE signal from the SRAM mimic circuitry, provide a delay, and forward the SAE signal to the sense amplifier.

8. The circuit of claim 1, wherein each of the plurality of selectable banks of the plurality of parallel-connected SRAM mimic cells comprises a different number of stacks of the pairs of series-connected pull-down transistors.

9. The circuit of claim 8, wherein the stacks of the pairs of series-connected pull-down transistors comprises at least two nFET transistors coupled in series.

10. The circuit of claim 9, wherein the stacks of the pairs of series-connected pull-down transistors have different voltage thresholds than transistors in the SRAM.

11. The circuit of claim 9, wherein the pull-up transistor comprises a pFET in the SRAM mimic circuitry, wherein the pFET and the stacks of the at least two series-connected nFET transistors mimic a read path in the SRAM cells.

12. An integrated circuit comprising:

SRAM cells;

a sense amplifier coupled to the SRAM cells; and

SRAM mimic circuitry comprising a plurality of selectable banks of a plurality of parallel-connected SRAM mimic cells, wherein the SRAM mimic circuitry is configured to select a subset of the selectable banks to drive a sense amplifier enable (SAE) signal for enabling the sense amplifier during a read operation of the SRAM cells, each of the plurality parallel-connected SRAM mimic cells comprises a different number of pairs of series-connected pull-down transistors, wherein a pull-up transistor connected in series with each of the pairs of series-connected pull-down transistors and a rail voltage providing a gate voltage of the pull-up transistor and wherein a gate voltage of the pairs of series-connected pull-down transistors of the subset of the selectable banks is adjusted to drive the SAE signal to mimic changes in SRAM cell current for read operations of the SRAM cells.

13. The integrated circuit of claim 12, further comprising:

an adjustable voltage supply configured to adjust the gate voltage of the pairs of series-connected pull-down transistors in the subset of the selectable banks.

14. The integrated circuit of claim 13 further comprising a feedback loop coupled to an output and an input of the SRAM mimic circuitry, wherein the feedback loop is configured to selectively bypass the adjustable voltage supply so that the rail voltage is used as the gate voltage of the pairs of series-connected pull-down transistors in the subset of selectable banks.

15. A method comprising:

testing operation of SRAM cells coupled to a sense amplifier during a read operation;

changing a number of selectable banks of a plurality of parallel-connected SRAM mimic cells that are selected, each of the plurality SRAM mimic cells comprises a different number of pairs of series-connected pull-down transistors, wherein a pull-up transistor connected in series with each of the pairs of series-connected pull-down transistors and a rail voltage providing a gate voltage of the pull-up transistor, and changing a gate voltage of the pairs of series-connected pull-down transistors in the SRAM mimic cells in order to adjust-a sense amplifier enable (SAE) signal that enables the sense amplifier;

identify parameters resulting in satisfactory performance of the read operation; and setting, based on the parameters, SRAM circuitry containing the number of the selectable banks of the plurality of parallel-connected SRAM mimic cells and an adjustable voltage supply that controls the gate voltage of the pairs of series-connected pull-down transistors of the number of the selectable banks to drive the SAE signal to mimic changes in SRAM cell current for read operations of the SRAM cells.

16. The method of claim 15, wherein the gate voltage is adjusted using a voltage divider, wherein the voltage divider comprises a plurality of wire resistors that have linear behavior across process, voltage, temperature (PVT) corners, wherein each of the plurality of wire resistors is selectively connected to ground by activating a respective control transistor connected to a respective wire resistor of the plurality of wire resistors.

17. The method of claim 15, wherein the pairs of series-connected pull-down transistors in the selectable banks of the plurality of parallel-connected SRAM mimic cells have a different threshold voltage than transistors in the SRAM cells.

18. The method of claim 15, further comprising:

delaying the SAE signal using a configurable delay circuit.

19. The method of claim 15, wherein each of the selectable banks of the plurality of parallel-connected SRAM mimic cells comprises a different number of stacks of the pairs of series-connected pull-down transistors.

20. The method of claim 19, wherein the stacks of the pairs of series-connected pull-down transistors comprises at least two nFET transistors coupled in series.

* * * * *